(12) United States Patent
Graham et al.

(10) Patent No.: US 9,073,749 B2
(45) Date of Patent: Jul. 7, 2015

(54) STRUCTURED GAP FOR A MEMS PRESSURE SENSOR

(71) Applicant: Robert Bosch GmbH, Stuttgart (DE)

(72) Inventors: Andrew B. Graham, Redwood City, CA (US); Gary Yama, Mountain View, CA (US); Gary O'Brien, Palo Alto, CA (US)

(73) Assignee: Robert Bosch GmbH, Stuttgart, DE (US)

( * ) Notice: Subject to any disclaimer, the term of this patent is extended or adjusted under 35 U.S.C. 154(b) by 0 days.

(21) Appl. No.: 13/705,441

(22) Filed: Dec. 5, 2012

(65) Prior Publication Data

US 2014/0151822 A1 Jun. 5, 2014

(51) Int. Cl.
*B81B 3/00* (2006.01)
*B81C 1/00* (2006.01)
*G01L 9/00* (2006.01)

(52) U.S. Cl.
CPC ............ *B81C 1/00642* (2013.01); *B81B 3/0021* (2013.01); *G01L 9/0047* (2013.01); *G01L 9/0073* (2013.01)

(58) Field of Classification Search
USPC ........................................................ 257/415
See application file for complete search history.

(56) References Cited

U.S. PATENT DOCUMENTS

| | | | |
|---|---|---|---|
| 6,167,761 B1 | 1/2001 | Hanzawa et al. | |
| 6,448,604 B1 * | 9/2002 | Funk et al. | 257/312 |
| 8,102,590 B2 | 1/2012 | Tung et al. | |
| 2008/0184787 A1 | 8/2008 | Coates | |
| 2010/0052081 A1 | 3/2010 | Donkers et al. | |
| 2010/0181631 A1 | 7/2010 | Lacey | |
| 2012/0062570 A1 | 3/2012 | Mignard | |
| 2013/0147021 A1 * | 6/2013 | Puurunen et al. | 257/635 |

FOREIGN PATENT DOCUMENTS

| | | | | |
|---|---|---|---|---|
| CN | 101740458 A | 6/2010 | | |
| EP | 2637007 | * 3/2012 | ................ | G01L 9/00 |

OTHER PUBLICATIONS

International Search Report and Written Opinion corresponding to PCT Application No. PCT/US2013/072694, mailed Mar. 25, 2014 (10 pages).

* cited by examiner

*Primary Examiner* — Matthew W Such
*Assistant Examiner* — Warren H Kilpatrick
(74) *Attorney, Agent, or Firm* — Maginot Moore & Beck LLP

(57) ABSTRACT

A method of fabricating a pressure sensor includes performing a chemical vapor deposition (CVD) process to deposit a first sacrificial layer having a first thickness onto a substrate. A portion of the first sacrificial layer is then removed down to the substrate to form a central region of bare silicon. One of a thermal oxidation process and an atomic layer deposition process is then performed to form a second sacrificial layer on the substrate having a second thickness in the central region that is less than the first thickness. A cap layer is then deposited over the first and second sacrificial layers. The second sacrificial layer is removed from the central region, and the first and second sacrificial layers are removed from a perimeter region that at least partially surrounds the central region on the substrate to form a contiguous, structured gap between the cap layer and the substrate, the structured gap having a first width in the central region and a second width in the perimeter region with the second width being greater than the first width.

9 Claims, 2 Drawing Sheets

STRUCTURED GAP FOR A MEMS PRESSURE SENSOR

TECHNICAL FIELD

This disclosure relates to capacitive micromechanical electrical system (MEMS) pressure sensors.

BACKGROUND

In general, capacitive MEMS pressure sensors include a fixed electrode that forms one plate of a parallel plate capacitor and a movable electrode that forms the other plate of the parallel plate capacitor. The fixed electrode is typically provided in a substrate, such as a silicon wafer. The movable electrode is incorporated into a deformable membrane that is suspended over the fixed electrode on the surface of the substrate. The deformable membrane is configured to deflect toward the substrate under an applied pressure which alters the gap between the fixed electrode and the movable electrode, resulting in a change in the capacitance between the two electrodes. By monitoring the change in capacitance between the fixed electrode and the movable electrode, a magnitude of a pressure applied to the deformable membrane can be determined.

The electrodes may be formed in a variety of different ways, such as by the deposition of a conductive film, electrical isolation of a conductive layer, adding a spacer layer between two conductive layers, and implant doping of the silicon substrate. In some capacitive MEMS pressure sensors, the deformable membrane and movable electrode are formed by an epitaxially deposited polysilicon ("epi-poly") cap layer. During fabrication of the sensor, the cap layer is deposited onto a sacrificial oxide layer formed on the substrate in the area of the fixed electrode. The sacrificial layer is then removed between epi-poly cap layer and the substrate to release the membrane and form a cavity between the movable electrode in the membrane and the fixed electrode in the substrate that defines the capacitive gap.

The geometry and dimensions of the epi-poly cap layer and the capacitive gap can be tailored to a certain degree to provide pressure sensors with a desired level of accuracy, sensitivity, and/or linearity. Higher pressure sensitivity typically requires more flexible membranes while higher accuracy and linearity require less flexible membranes. Membrane flexibility is determined in part by the size (e.g., lateral extent) and thickness of the membranes. Membranes with greater flexibility can typically be achieved by increasing the size or lateral extent of the membrane and/or by reducing the thickness of the membrane. Conversely, membranes with higher accuracy and linearity can be achieved by decreasing the lateral extent of the membrane and/or by increasing the thickness of the membrane.

The ability to achieve a desired level of accuracy, sensitivity, and/or linearity for a sensor depends at least in part on the precision and uniformity of the layers used to define the structures of the device, particularly the sacrificial oxide layer that defines the capacitive gap between the epi-poly cap layer and the substrate. A precise and uniform sacrificial layer promotes a precise and uniform capacitive gap in the sensor which in turn improves performance of the sensor by more closely matching design targets and by decreasing variations across the device.

The precision and uniformity of the sacrificial layer is dictated by the processes used to fabricate the sensor. Previously known fabrication methods typically used either a low pressure chemical vapor deposition (LPCVD) process or a thermal oxidation process to form the silicon dioxide sacrificial layer. A LPCVD process allows thicker depositions (e.g., >2 um), but the precision and uniformity of the depositions are limited. Thermal oxidation enables excellent precision and uniformity (e.g., several angstroms over an entire wafer), but the process is much slower. Therefore, thicker depositions require exposing the substrate to elevated temperatures for prolonged periods which may not be allowed by the thermal budget of the fabrication process.

DRAWINGS

DESCRIPTION

Figure 1:
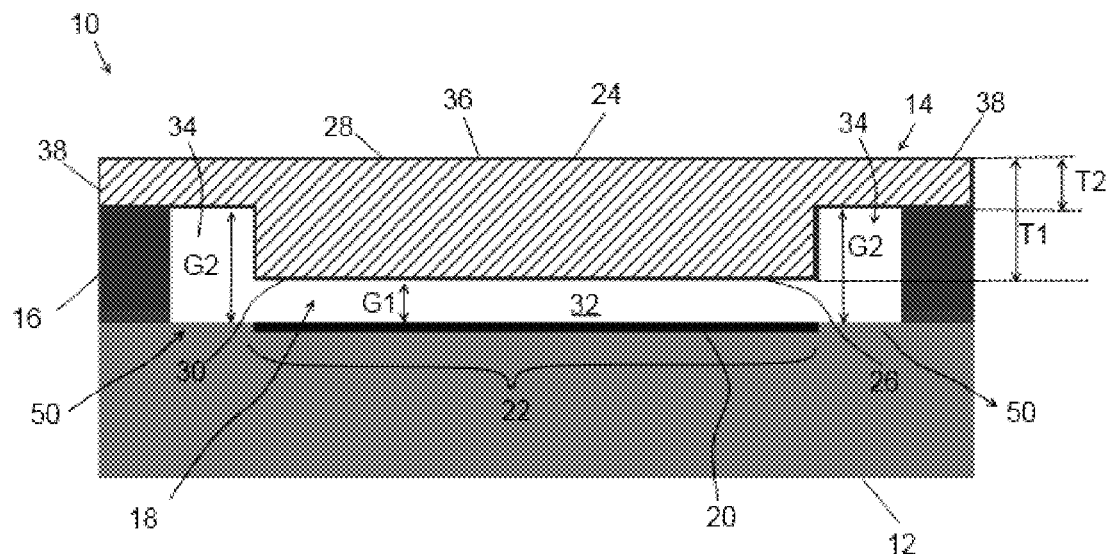
FIG. 1 depicts an embodiment of a capacitive MEMS pressure sensor having a structured gap in accordance with the present disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

In accordance with one embodiment of the present disclosure, a method of fabricating a pressure sensor includes performing a chemical vapor deposition (CVD) process to deposit a first sacrificial layer having a first thickness onto a substrate. A portion of the first sacrificial layer is then removed down to the substrate to form a central region of bare silicon. One of a thermal oxidation process and an atomic layer deposition process is then performed to form a second sacrificial layer on the substrate having a second thickness in the central region that is less than the first thickness. A cap layer is then deposited over the first and second sacrificial layers. The second sacrificial layer is removed from the central region, and the first and second sacrificial layers are removed from a perimeter region that at least partially surrounds the central region on the substrate to form a contiguous, structured gap between the cap layer and the substrate, the structured gap having a first width in the central region and a second width in the perimeter region with the second width being greater than the first width.

In accordance with another embodiment of the present disclosure, a semiconductor device is provided in an intermediate step of fabrication that comprises a substrate defining a sensing region and a perimeter region at least partially surrounding the sensing region. A first sacrificial layer is deposited onto the substrate and has a first thickness, the first sacrificial layer being located in the perimeter region. A second sacrificial layer is deposited onto the substrate using a thermal oxidation process or an atomic layer deposition process, the second sacrificial layer having a second thickness in the sensing region, the second thickness being less than the first thickness. A cap layer is deposited over the first and second sacrificial layers in the sensing region and the perimeter region.

In accordance with yet another embodiment, a semiconductor device comprises a substrate defining a sensing region on a surface of the substrate and including a first electrode located in the sensing region. The device includes a support layer on the substrate that forms a perimeter surrounding the sensing region. The support layer is spaced apart from the sensing region to define a perimeter region on the substrate that surrounds the sensing region. The device includes a flexible membrane having a second electrode. The flexible membrane is arranged on the support layer extending over the sensing region to position the second electrode above the first electrode. The flexible membrane has a lower surface that faces toward the substrate. The lower surface includes a central portion and a perimeter portion, the central portion being located above the sensing region of the substrate, the perimeter portion being located above the perimeter region on the substrate. The central portion of the lower surface of the membrane is spaced a first distance apart from the surface of the substrate, and the perimeter portion of the lower surface is spaced a second distance apart from the surface of the substrate, the second distance being greater than the first distance.

Referring now to the drawings, FIG. 1 depicts an embodiment of a capacitive MEMS pressure sensor 10 manufactured in accordance with the teachings of the present disclosure. The sensor 10 includes a substrate 12 and an epi-poly cap layer 14. In the embodiment of FIG. 1, the substrate 12 comprises a silicon substrate or wafer. In alternative embodiments, the substrate may comprise a silicon on insulator (SOI) substrate. The epi-poly cap layer 14 is suspended above the substrate 12 by a support layer 16 to form a cavity 18 between the cap layer 14 and the substrate 12. The cavity 18 defines a capacitive gap for the sensor 10 and is typically provided at or near vacuum; accordingly, the pressure sensor 10 is an absolute pressure sensor. In other embodiments, the cavity 18 is at a pressure level other than at or near vacuum, depending on the operating environment of the pressure sensor, among other factors.

The substrate 12 includes an electrode 20 formed in a sensing region 22 of the substrate 12 that is configured to serve as the lower electrode, or fixed electrode, of the capacitive pressure sensor 10. The lower electrode 20 may be formed in any suitable manner, such as by the deposition of a conductive film, electrical isolation of a conductive layer, adding a spacer layer between two conductive layers, and implant doping of the silicon substrate. The exact implementation of the lower electrode 20 in the substrate 12 depends in part on the desired performance characteristics of the sensor and the processes and materials used to fabricate the structures that define the sensor.

The epi-poly cap layer 14 comprises an epitaxial deposition of polysilicon that forms a flexible membrane 24 suspended over the lower electrode 20 by the support layer 16. In addition, the conductive polysilicon of the epi-poly cap layer 14 enables the membrane 24 to serve as the upper electrode 26, or movable electrode, for the capacitive pressure sensor 10. The membrane 24 includes an upper surface 28 and a lower surface 30. The upper surface faces away from the substrate, and the lower surface faces toward the substrate and defines a portion of the cavity.

The epi-poly cap layer 14 is deposited onto sacrificial oxide layers which are then removed to expose the gap 18 and release the membrane 24. Access openings (not shown) are typically formed through the cap layer to provide access to the sacrificial oxide for the introduction of an etchant material. Once the sacrificial oxide has been removed and the membrane 24 has been released, the cap layer 14 is sealed to close and seal the cavity in order to protect the functional elements of the sensor from contamination.

The gap 18 between the lower surface 30 of the membrane 24 and the surface of the substrate 12 is defined by the sacrificial oxide layers during the fabrication process. As discussed below, the sacrificial oxide layers are deposited on the substrate using a combination of chemical vapor deposition (CVD) and thermal oxidation or atomic layer deposition (ALD) which enables a structured sacrificial oxide layer to be formed on the substrate having a precisely controlled and substantially uniform thickness in the sensing region between the upper and lower electrodes and a greater thickness in the regions surrounding the sensing region that are not used for sensing.

Referring to FIG. 1, the structured sacrificial layer results in a structured gap 18 being defined between the membrane 24 and the substrate 12. The structured gap 18 includes a central gap portion 32 and a perimeter gap portion 34. The central gap portion 32 is located above the lower electrode 20 in the sensing region 22 of the substrate and has a width G1 between the surface of the substrate 21 and the lower surface 30 of the membrane 24. The perimeter gap portion 34 surrounds the central gap portion 32 outside the sensing region 22 of the substrate 12 and has a width G2 that is greater than the width G1. The width G1 corresponds to the desired width of the capacitive gap between the upper and lower electrodes 20, 26 of the sensor. The width G1 of the capacitive gap depends on many variables including the desired operating parameters of the sensor and may typically be anywhere in the range from approximately 1-1000 nm. In one embodiment, the gap width G1 is approximately 2 µm or less when using thermal oxidation to deposit the sacrificial layer in the sensing region 22, and in one particular embodiment, is approximately 1 µm. The gap width G1 may be approximately 100 nm or less when ALD is used to deposit the sacrificial layer in the sensing region 22.

The structured sacrificial layer also results in the lower surface 30 of the membrane layer having a stepped configuration including a central membrane portion and a perimeter membrane portion with different thicknesses. The central membrane portion 36 is located directly above the lower electrode 20 and has a thickness T1 between the upper and lower surfaces 28, 30. The perimeter membrane portion 38 surrounds the central membrane portion 36 that has a thickness T2 that is less than the thickness T1. The thickness T1 of the central membrane portion 36 may be any suitable thickness. As an example, the thickness T1 may be in the range from approximately 10 nm thick to several µm thick although greater and smaller thicknesses may be used. The thickness T2 depends on the thickness T1 and is selected to allow a certain degree of flexibility in the perimeter membrane portion 38 without impacting the structural integrity of the membrane. In one embodiment, the thickness T2 is in the range from approximately 5 nm thick to approximately 1 µm depending on the thickness T1. The thicknesses T1 and T2 of the central and perimeter membrane portions may be selected to correspond to a predetermined ratio. For example, the thickness T2 of the perimeter membrane portion 38 may be selected to be approximately 1/2 the thickness T1 of central membrane portion. Any suitable ratio may be used, e.g., 1/5, 1/4, 1/3, etc.

The structured configuration of the gap 18 and the membrane 24 that results from the multi-step formation of the sacrificial oxide layer has both mechanical and electrical benefits. For example, the greater thickness of the central portion 36 of the membrane 24 adds stiffness to the membrane which can lead to improved linearity in the response of the sensor. The increased thickness in the central portion of the membrane is offset by the reduced thickness in the perimeter portion 38 of the membrane 24 which adds flexibility and facilitates deflection of the central portion 36 of the membrane under an applied pressure. The larger gaps located outside of the sensing region 22 add robustness due to the increased travel allowed for any other devices or structures. The larger gaps outside of the sensing region also lead to a decrease in the parasitic capacitance associated with this region. The step created by the two levels of sacrificial oxide can also be used to create vertical over-travel stops for other devices and structures.

Figure 2:
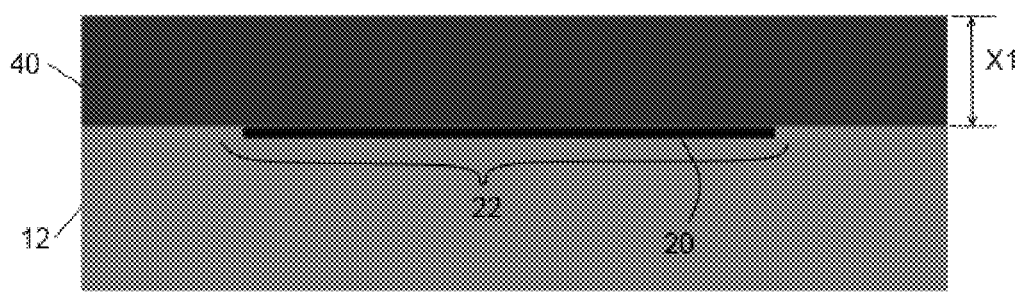
FIG. 2 depicts a cross-sectional view of an embodiment of a substrate for implementing the capacitive MEMS pressure sensor of FIG. 1 after deposition of the first sacrificial layer.

A process for fabricating a capacitive MEMS pressure sensor having a structured gap and membrane will now be described with reference to FIGS. 2-5. As depicted in FIG. 2, a first sacrificial layer 40 is formed on a silicon substrate 12 at a thickness X1. In one embodiment, the first sacrificial layer 40 comprises a silicon dioxide layer formed using a CVD process. Alternatively, the first sacrificial layer 40 may be formed using a thermal oxidation process. In another alternative embodiment, the substrate may comprise a SOI substrate. A lower electrode 20 for the capacitive pressure sensor is located on or in the substrate 12 and may be formed in any suitable manner, such as by the deposition of a conductive film, electrical isolation of a conductive layer, adding a spacer layer between two conductive layers, and implant doping of the silicon substrate.

Figure 3:
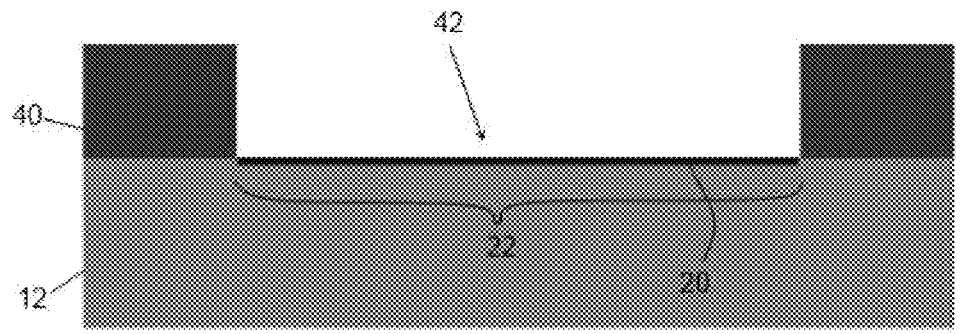
FIG. 3 depicts the substrate of FIG. 2 after the first sacrificial layer has been etched to form a region of bare silicon in the sensing region of the substrate.

Referring to FIG. 3, the first sacrificial layer 40 is lithographically patterned and removed down to the substrate 12 in the sensing region 22 where the electrode 20 is located to form a region of bare silicon 42. In one embodiment, the first sacrificial layer 40 is removed using an etchant, such as sulfur hexafluoride (SF6). Although not depicted in FIG. 3, additional or different patterning of the first sacrificial layer could be performed to realize other 3D structures on the substrate upon completion of the fabrication of the device.

Figure 4:
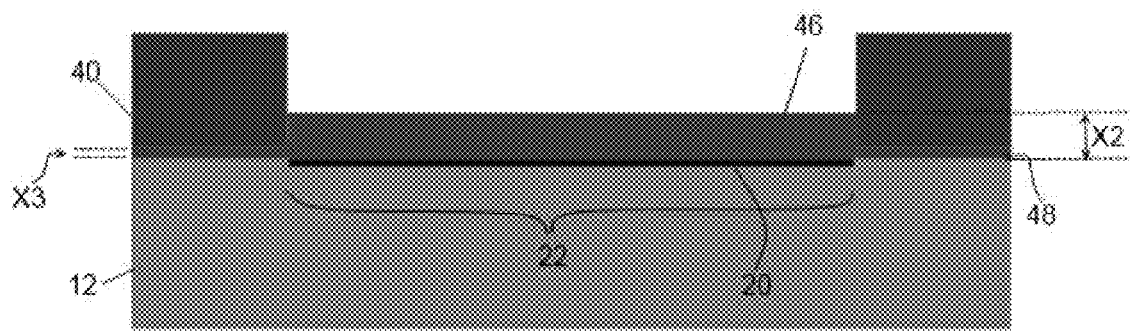
FIG. 4 depicts the substrate of FIG. 3 after the second sacrificial layer has been formed using a thermal oxidation process.

After the first sacrificial layer 40 is removed in the sensing region 22, a second sacrificial layer 46 is then deposited onto the substrate 12 using either a thermal oxidation process or an ALD process. An example of a second sacrificial layer 46 deposited using a thermal oxidation process is depicted in FIG. 4. As can be seen in FIG. 4, the thermal oxidation of the silicon results in a precisely controlled thermal oxide being grown on the bare silicon in the sensing region 22 to a thickness X2. An oxide film 48 having a thickness X3 is also formed on the substrate 12 in the regions of the substrate covered by the first sacrificial layer 40. The first sacrificial layer 40, however, slows the growth of the thermal oxide to a significant degree which results in the oxide film 48 being much thinner in these regions.

As an alternative to thermal oxidation, an ALD process may also be used to deposit the second sacrificial layer to a precisely controlled thickness in the sensing region. When ALD is used, an oxide film is formed on top of the first sacrificial layer rather than below the first sacrificial layer as depicted in FIG. 4. In another alternative embodiment, the second sacrificial layer 46 may be deposited only onto the sensing region 22 without extending into the perimeter region by using a selective-area deposition technique, e.g. masking.

Figure 5:
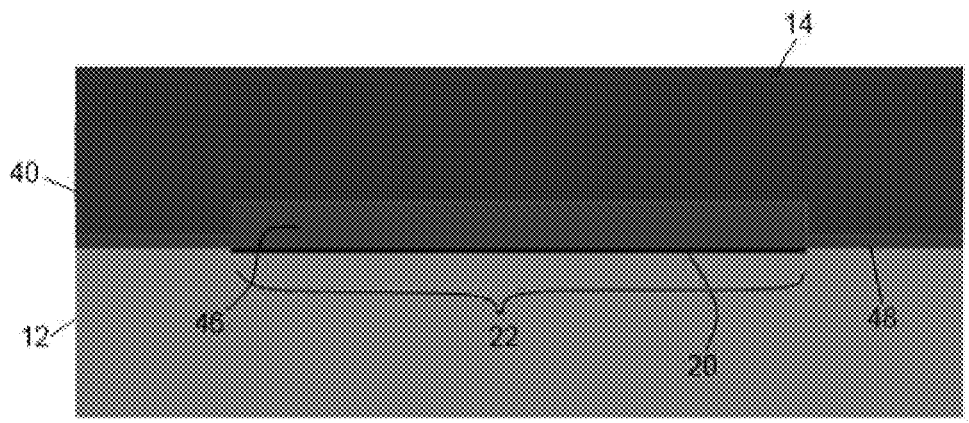
FIG. 5 depicts the substrate of FIG. 4 after the epi-poly cap layer has been deposited over the sacrificial layers and polished.

The two-step deposition process for the sacrificial layers results is a thicker sacrificial layer in regions not used for sensing with a precisely controlled thickness for defining gap width in the areas lithographically patterned for the thermal oxidation. As depicted in FIG. 5, the epitaxial polysilicon cap layer 14 is deposited on top of the first and second sacrificial layers 40, 46. The epi-poly cap layer 14 may be deposited in the manner described by Candler et al., "Long-Term and Accelerated Life Testing of a Novel Single-Wafer Vacuum Encapsulation for MEMS Resonators", Journal of Microelectricalmechanical Systems, vol. 15, no. 6, December 2006. In the embodiment of FIG. 5, the upper surface 28 of the cap layer 14 is polished to achieve a uniform, planar top surface.

After the cap layer 14 is formed, the second sacrificial layer 46 is removed from the area between the lower surface 26 of the cap layer 14 and the surface of the substrate 12 in the sensing region 22 as depicted in FIG. 1. The first and second sacrificial layers 40, 46 are also removed from a perimeter region 50 that surrounds the sensing region 22 on the substrate. The etch may be accomplished by any desired process. After the sacrificial layers have been etched and a portion of the cap layer over the sensing region has been released as depicted in FIG. 5, the cap layer 14 may be sealed to close the cavity and protect the cavity from contamination.

The structured configuration of the gap and the cap layer/ membrane that results from the multi-step formation of the sacrificial oxide layer has both mechanical and electrical benefits. For example, the greater thickness of the central portion of the membrane adds stiffness to the membrane which can lead to improved linearity in the response of the sensor. The increased thickness in the central portion of the membrane is offset by the reduced thickness in the perimeter portion of the membrane which adds flexibility and facilitates deflection of the central portion of the membrane under an applied pressure. The larger gaps located outside of the sensing region add robustness due to the increased travel allowed for any other devices or structures. The larger gaps outside of the sensing region also lead to a decrease in the parasitic capacitance associated with this region. Although not shown, the step created by the two levels of sacrificial oxide can also be used to create vertical over-travel stops for other devices and structures.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of fabricating a pressure sensor comprising:
   performing chemical vapor deposition (CVD) process to deposit a first sacrificial layer having a first thickness onto a substrate;
   removing a portion of the first sacrificial layer down to the substrate to form a central region of bare silicon;
   performing one of a thermal oxidation process and an atomic layer deposition process after removing the portion of the first sacrificial layer to form a second sacrificial layer on the region of bare silicon of the substrate and on top of or below the remaining first sacrificial layer, the second sacrificial layer having a second thickness in the central region, the second thickness being less than the first thickness and greater than a thickness of the second sacrificial layer on top of or below the first sacrificial layer;

depositing a cap layer over the first and second sacrificial layers; and after depositing the cap layer, removing the second sacrificial layer from the central region and removing the first and second sacrificial layers from a perimeter region that at least partially surrounds the central region on the substrate to form a contiguous, structured gap between the cap layer and the substrate, the structured gap having a first width in the central region and a second width in the perimeter region, the second width being greater than the first width.

2. The method of claim 1, wherein the cap layer comprises an epitaxial deposition of polysilicon.

3. The method of claim 2, wherein the first sacrificial layer comprises silicon dioxide.

4. The method of claim 3, wherein the first sacrificial layer is removed to form the central region of bare silicon by etching.

5. The method of claim 1, wherein the second sacrificial layer is formed using a thermal oxidation process such that the second sacrificial layer comprises a thermal oxide, the thermal oxide being grown to the second thickness in the central region of the substrate and being grown to a third thickness on regions of the substrate covered by the first sacrificial layer, the third thickness being less than the second thickness.

6. The method of claim 1, wherein the second sacrificial layer is formed using an atomic layer deposition process such that the second sacrificial layer comprises a silicon oxide, the thermal oxide being grown to the second thickness in the central region of the substrate and being grown to a third thickness on regions of the substrate covered by the first sacrificial layer, the third thickness being less than the second thickness.

7. The method of claim 2, wherein the second thickness is approximately 1-1000 nm.

8. The method of claim 1, wherein the structured gap is formed by etching the first and second sacrificial layers in the central region and the perimeter region of the substrate.

9. The method of claim 1, further comprising:
sealing the cap layer.

* * * * *